United States Patent
Kim et al.

(10) Patent No.: US 10,002,914 B2
(45) Date of Patent: Jun. 19, 2018

(54) METHOD OF MANUFACTURING A DISPLAY APPARATUS HAVING PIXELS AREAS WITH DIFFERENT THICKNESSES

(71) Applicant: Samsung Display Co., Ltd., Yongin-si, Gyeonggi-do (KR)

(72) Inventors: Seonju Kim, Yongin-si (KR); Youngrok Song, Yongin-si (KR); Jungbae Song, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/473,347

(22) Filed: Mar. 29, 2017

(65) Prior Publication Data

US 2017/0207283 A1    Jul. 20, 2017

Related U.S. Application Data

(62) Division of application No. 14/927,324, filed on Oct. 29, 2015, now Pat. No. 9,653,527.

(30) Foreign Application Priority Data

Mar. 30, 2015 (KR) ........................ 10-2015-0044394

(51) Int. Cl.
*H01L 27/32* (2006.01)
*H01L 51/52* (2006.01)
(Continued)

(52) U.S. Cl.
CPC ........ *H01L 27/3246* (2013.01); *C23C 14/021* (2013.01); *C23C 14/042* (2013.01);
(Continued)

(58) Field of Classification Search
CPC ..... H01L 51/5271; H01L 22/10; H01L 22/12; H01L 27/3246
See application file for complete search history.

(56) References Cited

U.S. PATENT DOCUMENTS

| 2010/0156280 A1 | 6/2010 | Song et al. |
| 2010/0297348 A1 | 11/2010 | Lee et al. |

(Continued)

FOREIGN PATENT DOCUMENTS

| JP | 2000-277446 | 10/2000 |
| JP | 2003-272858 | 9/2003 |

(Continued)

*Primary Examiner* — Dung Le
(74) *Attorney, Agent, or Firm* — Knobbe, Martens, Olson & Bear, LLP

(57) ABSTRACT

A method of manufacturing a display apparatus having a base with a plurality of pixel electrode and pixel definition layers, wherein the base is divided into a plurality of areas comprising a first area and a second area; the method comprising measuring reflectivities of the first and second areas, wherein a measured reflectivity of the first area is different from that of the second area; placing the base in a deposition chamber; and forming a first intermediate layer over a first one of the pixel electrodes in the first area; moving the base relative to the deposition unit; forming a second intermediate layer over a second one of the pixel electrodes in the second area, wherein the first intermediate layer has a first thickness and the second intermediate layer has a second thickness different from the first thickness.

9 Claims, 4 Drawing Sheets

(51) Int. Cl.
*H01L 51/56* (2006.01)
*H01L 21/66* (2006.01)
*C23C 14/24* (2006.01)
*C23C 14/54* (2006.01)
*C23C 14/02* (2006.01)
*C23C 14/04* (2006.01)
*C23C 14/58* (2006.01)
*H01L 51/00* (2006.01)

(52) U.S. Cl.
CPC ............ *C23C 14/24* (2013.01); *C23C 14/542* (2013.01); *C23C 14/547* (2013.01); *C23C 14/5826* (2013.01); *H01L 22/10* (2013.01); *H01L 22/12* (2013.01); *H01L 22/20* (2013.01); *H01L 27/3258* (2013.01); *H01L 51/001* (2013.01); *H01L 51/0017* (2013.01); *H01L 51/0031* (2013.01); *H01L 51/5206* (2013.01); *H01L 51/5271* (2013.01); *H01L 51/56* (2013.01); *H01L 2227/323* (2013.01); *H01L 2251/558* (2013.01)

(56) References Cited

U.S. PATENT DOCUMENTS

| | | |
|---|---|---|
| 2011/0053300 A1 | 3/2011 | Ryu et al. |
| 2014/0027732 A1 | 1/2014 | Pyo et al. |
| 2014/0264295 A1 | 9/2014 | Sim et al. |

FOREIGN PATENT DOCUMENTS

| | | |
|---|---|---|
| KR | 10-2011-0021623 | 3/2011 |
| KR | 10-2011-0082418 | 7/2011 |
| KR | 10-2014-0022625 | 2/2014 |
| KR | 10-2014-0044313 | 4/2014 |

METHOD OF MANUFACTURING A DISPLAY APPARATUS HAVING PIXELS AREAS WITH DIFFERENT THICKNESSES

CROSS-REFERENCE TO RELATED PATENT APPLICATION

This application is a division of U.S. patent application Ser. No. 14/927,324, filed Oct. 29, 2015, now U.S. Pat. No. 9,653,527, issued on May 16, 2017, and further claims priority to and the benefit of Korean Patent Application No. 10-2015-0044394, filed on Mar. 30, 2015, in the Korean Intellectual Property Office. The disclosure of each U.S. patent application Ser. No. 14/927,324, filed Oct. 29, 2015 and Korean Patent Application No. 10-2015-0044394, filed on Mar. 30, 2015 is incorporated herein in its entirety by reference.

BACKGROUND

1. Field

One or more embodiments relate to a display apparatus, an apparatus for manufacturing the display apparatus, and a method of manufacturing the display apparatus.

2. Discussion of the Related Technology

Electronic devices based on mobility have come into widespread use. Recently, tablet personal computers (PCs), in addition to small-sized electronic devices such as mobile phones, have been widely used as mobile electronic devices.

In order to support various functions, the mobile electronic devices include a display unit for providing a user with visual information such as images or videos. Recently, as components for driving such display units have become miniaturized, occupancy of the display units in electronic devices has gradually been increasing. Moreover, a structure that may be curved to have a predetermined angle of curvature has been developed.

SUMMARY

One aspect of the invention provides a display apparatus, which may comprise: a base comprising; a substrate, a plurality of pixel electrodes formed over the substrate, and a pixel definition layer formed over the plurality of pixel electrodes; and an intermediate layer formed over each of the plurality of pixel electrodes of the base, wherein the base is divided into a plurality of areas which comprises a first area and a second area, wherein the intermediate layer formed over the first area of the base has a first thickness, and the intermediate layer formed over the second area of the base has a second thickness substantially different from the first thickness.

In the foregoing apparatus, the first and second areas may have first and second reflectivities, respectively, wherein the first and second reflectivities are substantially different from each other. The intermediate layer may comprise a common layer and a functional layer, and wherein at least one of the common layer and the functional layer of the intermediate layer formed over the first area of the base has a thickness substantially different from that of at least one of the common layer and the functional layer of the intermediate layer formed over the second area of the base.

Another aspect of the invention provides an apparatus for manufacturing a display apparatus, which may comprise: a cleaning unit configured to clean a base which is an intermediate product for making the display apparatus; a drying unit configured to dry the base received from the cleaning unit; a reflectivity measuring unit configured to measure reflectivities of a plurality of areas of the base; and a deposition unit configured to form at least an intermediate layer over each of plurality of areas of the base, the intermediate layers formed over the plurality of areas of the base having different thicknesses based on the reflectivities of the plurality of areas measured by the reflectivity measuring unit.

In the foregoing apparatus, the apparatus may further comprise a plasma processing unit which is connected to the deposition unit and configured to perform plasma processing on the base. The reflectivity measuring unit may be provided between the drying unit and the plasma processing unit or in at least one selected from the drying unit and the plasma processing unit. The deposition unit may comprise: a deposition source configured to discharge a deposition material; a deposition source nozzle unit disposed at a side of the deposition source and including a plurality of deposition source nozzles; and a slit sheet disposed opposite to the deposition source and including a plurality of slits through which the deposition material passes, wherein the deposition source is configured to deposit the deposition material over the base to form the intermediate layers with different thicknesses, by forming different temperatures according to the reflectivities of the plurality of areas of the base.

Still in the foregoing apparatus, the deposition unit may be configured to form a thickness of the intermediate layer on a center portion of the base to be different from a thickness of the intermediate layer on another portion of the base that has a reflectivity that is different from that of the center portion of the base. When the reflectivity of the center portion of the base is greater than the reflectivity of the other portion of the base, the thickness of the intermediate layer over the center portion of the base may be formed to be smaller than the thickness of the intermediate layer over the other portion of the base. The base may comprise: a substrate, a plurality of pixel electrodes formed over the substrate, and a pixel definition layer formed over the substrate and the plurality of pixel electrodes, wherein the intermediate layer is formed each of the plurality of pixel electrodes. The intermediate layer may comprise a common layer and a functional layer, and wherein at least one selected from a thickness of the common layer and a thickness of the functional layer varies according to the plurality of areas of the base.

A further aspect of the invention provides a method of manufacturing a display apparatus, which may comprise: providing a base comprising: a substrate, a plurality of pixel electrodes formed over the substrate, and a pixel definition layer formed over the substrate and the plurality of pixel electrodes, wherein the base is divided into a plurality of areas comprising a first area and a second area; measuring reflectivities of the first and second areas wherein a measured reflectivity of the first area is different from that of the second area; placing the base in a deposition chamber to be spaced from a deposition unit provided in the deposition chamber; and forming a first intermediate layer over a first one of the pixel electrodes in the first area; moving the base relative to the deposition unit; forming a second intermediate layer over a second one of the pixel electrodes in the second area, wherein the first intermediate layer has a first thickness and the second intermediate layer has a second thickness different from the first thickness.

In the foregoing method, the method may further comprise: cleaning the base; and drying the cleaned base. The method may further comprise performing plasma processing on the base. The deposition unit may comprise a plurality of deposition sources configured to emit the deposition material, and wherein a temperature of each of the plurality of deposition sources is controlled based on the reflectivity of each of the plurality of areas. The method may further comprise adjusting a temperature of deposition sources such that the temperature of the deposition sources for forming the first intermediate layer is different from that of the deposition sources for forming the second intermediate layer, wherein the first area is a center portion of the base and the second area is another portion of the first base. The first area may be a center portion of the base and the second area is another portion of the first base. The reflectivity of the first area may be greater than that of the second area, wherein the thickness of the first intermediate layer is smaller than that of the second intermediate layer. The intermediate layers formed over the first area may have substantially the same thickness. The intermediate layer may comprise a common layer and a functional layer, and at least one selected from a thickness of the common layer and a thickness of the functional layer varies according to the plurality of areas of the base.

One or more embodiments include a display apparatus and an apparatus for and a method of manufacturing the display apparatus.

Additional aspects will be set forth in part in the description which follows and, in part, will be apparent from the description, or may be learned by practice of the presented embodiments.

According to one or more embodiments of the present invention, a display apparatus includes a first substrate on which a plurality of pixel electrodes are formed; a pixel definition layer formed on the plurality of pixel electrodes; and an intermediate layer formed on each of the plurality of pixel electrodes, wherein the first substrate is divided into a plurality of areas, and thicknesses of the intermediate layer in at least two of the plurality of areas are different from each other.

A thickness of the intermediate layer may vary according to reflectivities of the plurality of areas of the first substrate.

The intermediate layer may include a common layer and a functional layer, and at least one selected from a thickness of the common layer and a thickness of the functional layer may vary in the plurality of areas of the first substrate.

According to one or more embodiments of the present invention, an apparatus for manufacturing a display apparatus includes a cleaning unit configured to clean a first substrate; a drying unit configured to dry the first substrate received from the cleaning unit; a reflectivity measuring unit configured to measure reflectivities of a plurality of areas into which the dried first substrate is divided; and a deposition unit configured to form an intermediate layer having different thicknesses on each pixel electrode, based on the reflectivities of the plurality of areas measured by the reflectivity measuring unit.

The apparatus may further include a plasma processing unit which is connected to the deposition unit and performs plasma processing on the first substrate.

The reflectivity measuring unit may be provided between the drying unit and the plasma processing unit or in at least one selected from the drying unit and the plasma processing unit.

The deposition unit may include a deposition source that discharges a deposition material; a deposition source nozzle unit disposed at a side of the deposition source and including a plurality of deposition source nozzles; and a patterning slit sheet disposed opposite to the deposition source and including a plurality of patterning slits through which the deposition material passes. The deposition source may deposit the deposition material on the first substrate to have different thicknesses, by forming different temperatures according to the reflectivities of the first substrate.

The deposition unit may form a thickness of the intermediate layer on a center portion of the first substrate to be different from a thickness of the intermediate layer on another portion of the first substrate that has reflectivity that is different from reflectivity of the center portion of the first substrate.

When the reflectivity of the center portion of the first substrate is greater than the reflectivity of the other portion of the first substrate, the thickness of the center portion of the first substrate may be formed to be smaller than the thickness of the other portion of the first substrate.

When the reflectivity of the center portion of the first substrate is smaller than the reflectivity of the other portion of the first substrate, the thickness of the center portion of the first substrate may be formed to be greater than the thickness of the other portion of the first substrate.

The intermediate layer may include a common layer and a functional layer, and at least one selected from a thickness of the common layer and a thickness of the functional layer may vary according to the plurality of areas of the first substrate.

According to one or more embodiments of the present invention, a method of manufacturing a display apparatus includes dividing a first substrate on which a plurality of pixel electrodes and a pixel definition layer have been formed, into a plurality of areas and measuring reflectivities of the plurality of pixel electrodes; disposing the first substrate to be separated from a deposition unit; and forming an intermediate layer differently on the plurality of areas of the first substrate by differently depositing a deposition material on the plurality of areas of the first substrate according to the measured reflectivities, while the deposition unit or the first substrate is moved relative to each other.

The method may further include cleaning the first substrate; and drying the cleaned first substrate.

The method may further include performing plasma processing on the first substrate.

The deposition unit may include a plurality of deposition sources which emit the deposition material, and a temperature of each of the plurality of deposition sources may be controlled to vary based on the reflectivities.

The temperature of the deposition sources may be controlled to vary in a center portion of the first substrate and another portion of the first substrate that has reflectivity that is different from reflectivity of the center portion of the first substrate.

A thickness of the intermediate layer on a center portion of the first substrate may be formed to be different from a thickness of the intermediate layer on another portion of the first substrate that has reflectivity that is different from reflectivity of the center portion of the first substrate.

When the reflectivity of the center portion of the first substrate is greater than the reflectivity of the other portion of the first substrate, the thickness of the center portion of the first substrate may be formed to be smaller than the thickness of the other portion of the first substrate.

When the reflectivity of the center portion of the first substrate is smaller than the reflectivity of the other portion of the first substrate, the thickness of the center portion of the first substrate may be formed to be greater than the thickness of the other portion of the first substrate.

The intermediate layer may include a common layer and a functional layer, and at least one selected from a thickness of the common layer and a thickness of the functional layer may vary according to the plurality of areas of the first substrate.

These embodiments may be implemented by using a system, a method, a computer program, or a combination thereof.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
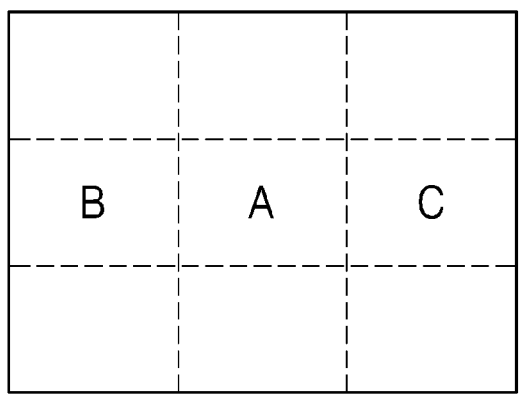
FIG. 1 is a plan view of a display apparatus according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
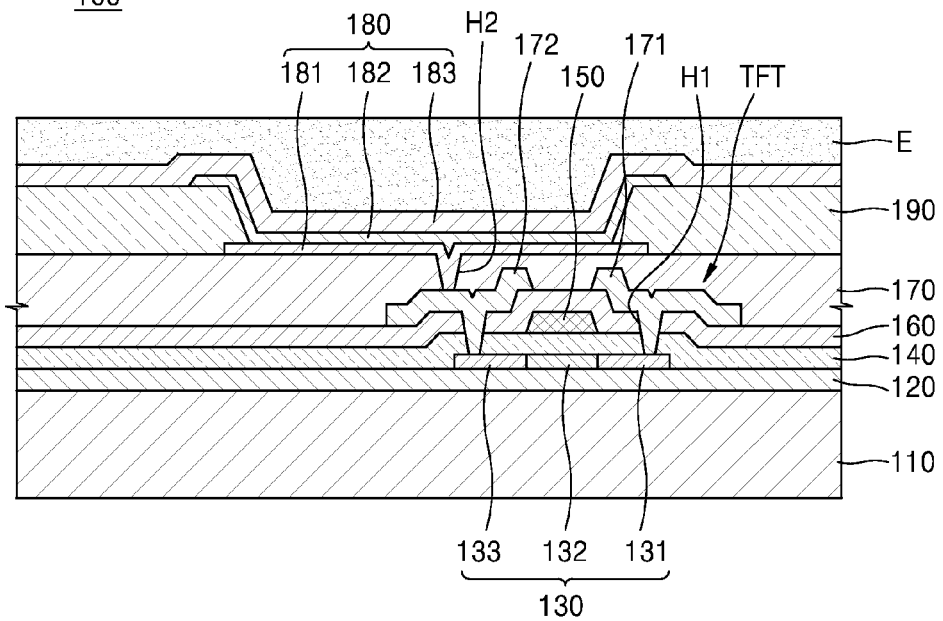
FIG. 2 is a cross-sectional view of a portion of an area A of the display apparatus of FIG. 1.
Figure 3:
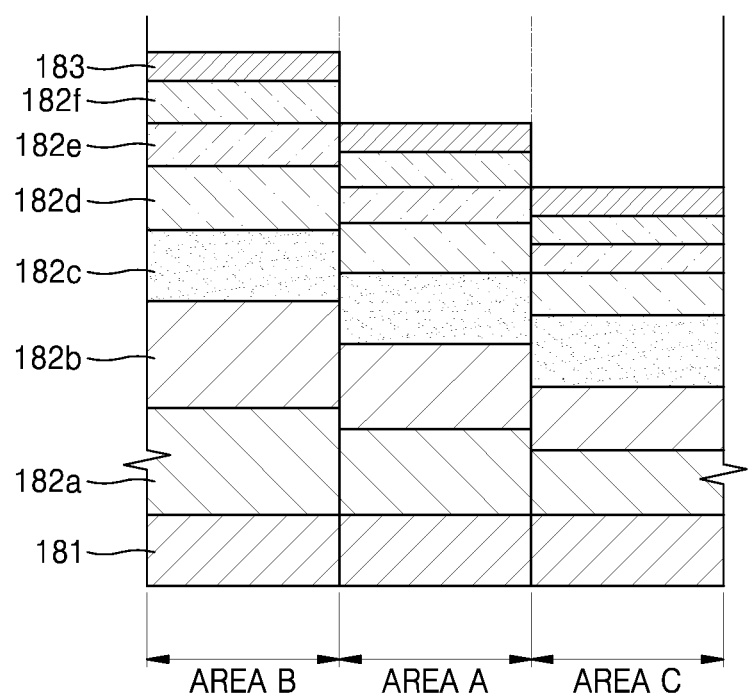
FIG. 3 is a cross-sectional view for comparing pixel heights of areas having different reflectivities in the display apparatus of FIG. 1 with one another.

FIG. 1 is a plan view of a display apparatus 100 according to an embodiment of the present invention. FIG. 2 is a cross-sectional view of a portion of an area A of the display apparatus 100 of FIG. 1. FIG. 3 is a cross-sectional view for comparing pixel heights of areas having different reflectivities in the display apparatus 100 of FIG. 1 with one another.

Referring to FIGS. 1-3, the display apparatus 100 may include a first substrate 110 and a light-emission unit. The display apparatus 100 may also include a thin-film encapsulation layer E or a second substrate formed on an upper surface of the light-emission unit. The second substrate is the same as or similar to a second substrate used in a general display apparatus, and thus a detailed description thereof will be omitted herein. In addition, for convenience of description, a case where the display apparatus 100 includes the thin-film encapsulation layer E will now be described in detail.

The display apparatus 100 may be divided into a plurality of areas to measure reflectivity. For example, the display apparatus 100 may be divided into 4 areas. According to another embodiment, the display apparatus 100 may be divided into 6 areas. According to another embodiment, the display apparatus 100 may be divided into 9 areas. The division of the display apparatus 100 is not limited thereto, and the display apparatus 100 may be divided into at least two areas. For convenience of description, a case where the display apparatus 100 is divided into 9 areas will now be described in detail.

At least two of the nine areas of the display apparatus 100 may have different reflectivities. According to another embodiment, the nine areas of the display apparatus 100 may have the same reflectivity. The reflectivity may be reflectivity measured when a pixel electrode 181 and a pixel definition layer 190 have been formed on the first substrate 110. In embodiments, the first substrate 110 and the pixel electrode and the pixel defining layer 190 form a base for forming an intermediate layer discussed below. In embodiments, the base may include one or more additional layers which are formed over the first substrate prior to forming the intermediate layer. The base may be divided into the plurality of areas for measuring the reflectivity. In embodiments, when measuring reflectivity of each area of the base, the reflectivity of a surface of the base on or over which the intermediate is formed is measured. In some embodiments, differences between the reflectivities of the plurality of areas may be caused by the reflectivity differences of the pixel electrodes.

For convenience of description, a case where the area A, an area B, and an area C of the nine areas of the display apparatus 100 have different reflectivities will now be described in detail. A case where the reflectivity of the area B is smaller than the reflectivity of the area A and the reflectivity of the area C is greater than the reflectivity of the area A will now be described in detail.

With regard to a structure of the display apparatus 100, the light-emission unit may be formed on the first substrate 110. The light-emission unit may include a thin film transistor TFT, a passivation layer 170 covering the thin film transistor TFT, and an organic light-emitting diode (OLED) 180 formed on the passivation layer 170.

The first substrate 110 may be formed of a glass material, but embodiments of the invention are not limited thereto. The first substrate 110 may be formed of a plastic material or a metal material, such as, steel use stainless (SUS) or titanium (Ti). Alternatively, the first substrate 110 may use polyimide (PI). For convenience of description, a case where the first substrate 110 is formed of a glass material will now be described in detail.

A buffer layer 120 formed of an organic compound and/or an inorganic compound is further formed on an upper surface of the first substrate 110. The buffer layer 120 may be formed of silicon oxide ($SiO_x$) ($x \geq 1$) or silicon nitride ($SiN_x$) ($x \geq 1$).

An active layer 130 arranged in a predetermined pattern is formed on the buffer layer 120 and is then buried by a gate insulating layer 140. The active layer 130 includes a source region 131 and a drain region 133 and further includes a channel region 132 therebetween.

The active layer 130 may be formed to include various materials. For example, the active layer 130 may include an inorganic semiconductor material such as amorphous silicon or crystalline silicon. As another example, the active layer 130 may include an oxide semiconductor. As another example, the active layer 130 may include an organic semiconductor material. However, for convenience of description, a case where the active layer 130 is formed of amorphous silicon will now be described in detail.

The active layer 130 may be formed by forming an amorphous silicon layer on the buffer layer 120, crystallizing the amorphous silicon layer to form a polycrystalline silicon layer, and patterning the polycrystalline silicon layer. The source region 131 and the drain region 133 of the active layer 130 are doped with impurities according to a TFT type, such as a driving TFT, a switching TFT, or the like.

A gate electrode 150 facing the active layer 130, and an interlayer insulating layer 160 which buries the gate electrode 150 are formed on an upper surface of the gate insulating layer 140.

Contact holes H1 are formed in the interlayer insulating layer 160 and the gate insulating layer 140, and then a source electrode 171 and a drain electrode 172 are formed on the interlayer insulating layer 160 such that the source electrode 171 and the drain electrode 172 contact the source region 131 and the drain region 133, respectively.

The passivation layer 170 is formed on the thin film transistor TFT formed as described above, and a pixel electrode 181 of the OLED 180 is formed on the passivation layer 170. The pixel electrode 181 contacts the drain electrode 172 of the thin-film transistor TFT through a via hole H2 formed in the passivation layer 172. The passivation layer 170 may be formed of an inorganic material and/or an organic material and as a single layer or multiple layers. The passivation layer 170 may be formed as a planarization layer such that an upper surface thereof is flat regardless of the unevenness of a lower layer under the passivation layer 170. The passivation layer 170 may be formed of a transparent insulator so that a resonance effect is achieved.

After forming the pixel electrode 181 on the passivation layer 170, the pixel-definition layer 190 is formed of an organic material and/or an inorganic material such that the pixel-definition layer 190 covers the pixel electrode 181 and the passivation layer 170. The pixel-definition layer 190 has an aperture via which the pixel electrode 181 is exposed.

An intermediate layer 182 and an opposite electrode 183 are formed on at least the pixel electrode 181. In some embodiments, the intermediate layer 182 may include all the layers formed between the pixel electrode 181 and the opposite electrode 183. In this case, a thickness of the intermediate layer 182 may represent the distance between surfaces of the pixel and opposite electrodes 181 and 183 which face the intermediate layer 182.

The pixel electrode 181 functions as an anode, and the opposite electrode 183 functions as a cathode. Alternatively, the pixel electrode 181 may function as a cathode, and the opposite electrode 183 may function as an anode. In embodiments, the opposite electrode 183 may be formed as a common electrode covering all the intermediate layers 182 in the display area. The display apparatus 100 includes a plurality of pixels, each of which includes a pixel electrode 181, an intermediate layer 182 and an opposite layer 183.

The pixel electrode 181 and the opposite electrode 183 are insulated from each other by the intermediate layer 182, and respectively apply voltages of opposite polarities to the intermediate layer 182 to induce light emission in an organic emission layer.

The intermediate layer 182 may include an organic emission layer. As another example, the intermediate layer 182 includes an organic emission layer 182d. However, the intermediate layer 182 may further include at least one selected from a hole injection layer (HIL) 182a, a hole transport layer (HTL) 182b, an electron transport layer (ETL) 182e, and an electron injection layer (EIL) 182f, which are common layers. The present embodiment is not limited thereto, and the intermediate layer 182 may further include a functional layer 182c in addition to an organic emission layer. The functional layer 182c may be formed in any of various shapes. For example, the functional layer 182c may include a light-emission assist layer which assists light emission of the organic emission layer 182d. The functional layer 182c may include an assist layer capable of increasing that controls luminescence efficiency, color purity, or the like. For example, the assist layer may be formed of the same material as that of the HTL 182b.

One unit pixel P includes a plurality of sub-pixels R, G and B, and the plurality of sub-pixels R, G and B may emit light of various colors. For example, the unit pixel P may include a plurality of sub-pixels R, G and B which respectively emit red light, green light, and blue light, or a plurality of sub-pixels which respectively emit red light, green light, blue light, and white light.

The intermediate layer 182 may vary according to different areas. For example, the thickness of the intermediate layer 182 may vary according to reflectivities of different areas. For convenience of explanation, the reflectivity of the area A is a first reflectivity, the reflectivity of the area B is a second reflectivity, the reflectivity of the area C is a third reflectivity, the thickness of the intermediate layer 182 in the area A is a first thickness, the thickness of the intermediate layer 182 in the area B is a second thickness, and the thickness of the intermediate layer 182 in the area C is a third thickness. This will now be described in detail.

As described above, the first reflectivity is greater than the second reflectivity, and thus the first thickness may be smaller than the second thickness. Since the first reflectivity is smaller than the third reflectivity, the first thickness may be greater than the third thickness. In embodiments, the thickness of all the intermediate layers 182 formed over the same area of the base may be substantially the same throughout that area. In some embodiments, a method of varying the thickness of the intermediate layer 182 may be a method of varying the thickness of at least one selected from the common layers and the functional layer 182c.

In an example of a display device, the intermediate layer 182 may be formed to have a constant thickness throughout the device, and the base has different reflectivities according to locations thereof. Then, different resonance effects may be generated, and thus color may be non-uniform. However, when the intermediate layer 182 has different thicknesses depending on different reflectivities as described above, color saturation non-uniformity due to a difference between resonance effects may be reduced or minimized.

The thin-film encapsulation layer E may include a plurality of inorganic layers or include an inorganic layer and an organic layer.

The organic layer of the thin-film encapsulation layer E is formed of a polymer and may be a single layer or a layer stack formed of polyethylene terephthalate (PET), PI, polycarbonate (PC), epoxy, polyethylene, or polyacrylate. The organic layer may be formed of polyacrylate. In detail, the organic layer may include a result of polymerizing a monomer composition including a diacrylate-based monomer and a triacrylate-based monomer. The monomer composition may further include monoacrylate-based monomer. The monomer composition may further include a well-known photoinitiator such as trimethyl benzoyl diphenyl phosphine oxide (TPO), but embodiments of the present invention are not limited thereto.

The inorganic layer of the thin-film encapsulation layer E may be a single layer or a layer stack including metal oxide or metal nitride. In detail, the inorganic layer may include $SiN_x$, $Al_2O_3$, $SiO_2$, or $TiO_2$.

An uppermost layer exposed to the outside in the thin-film encapsulation layer E may be formed of an inorganic layer to prevent infiltration of moisture to the OLED 180.

The thin-film encapsulation layer E may include at least one sandwich structure in which at least one organic layer is interposed between at least two inorganic layers. Alternatively, the thin-film encapsulation layer E may include at least one sandwich structure in which at least one inorganic layer is interposed between at least two organic layers. Alternatively, the thin-film encapsulation layer E may include a sandwich structure in which at least one organic layer is interposed between at least two inorganic layers and a sandwich structure in which at least one inorganic layer is interposed between at least two organic layers.

The thin-film encapsulation layer E may include a first inorganic layer, a first organic layer, and a second inorganic layer sequentially formed starting from an upper portion of the OLED 180.

Alternatively, the thin-film encapsulation layer E may include a first inorganic layer, a first organic layer, a second inorganic layer, a second organic layer, and a third inorganic layer sequentially formed starting from the upper portion of the OLED 180.

Alternatively, the thin-film encapsulation layer E may include a first inorganic layer, a first organic layer, a second inorganic layer, a second organic layer, a third inorganic layer, a third organic layer, and a fourth inorganic layer sequentially formed starting from the upper portion of the OLED 180.

A halogenated metal layer including lithium fluoride (LiF) may be further included between the OLED 180 and the first inorganic layer. The halogenated metal layer may prevent the OLED 180 from being damaged when the first inorganic layer is formed by sputtering.

The first organic layer may have a smaller area than the second inorganic layer, and the second organic layer may also have a smaller area than the third inorganic layer.

Accordingly, the display apparatus 100 may improve the color saturation uniformity of the entire first substrate 110 by optimizing the thickness of the intermediate layer 182 according to areas of the first substrate 110 that have different reflectivities.

A method of forming the intermediate layer 182 by using a display apparatus manufacturing apparatus will now be described in detail.

Figure 4:
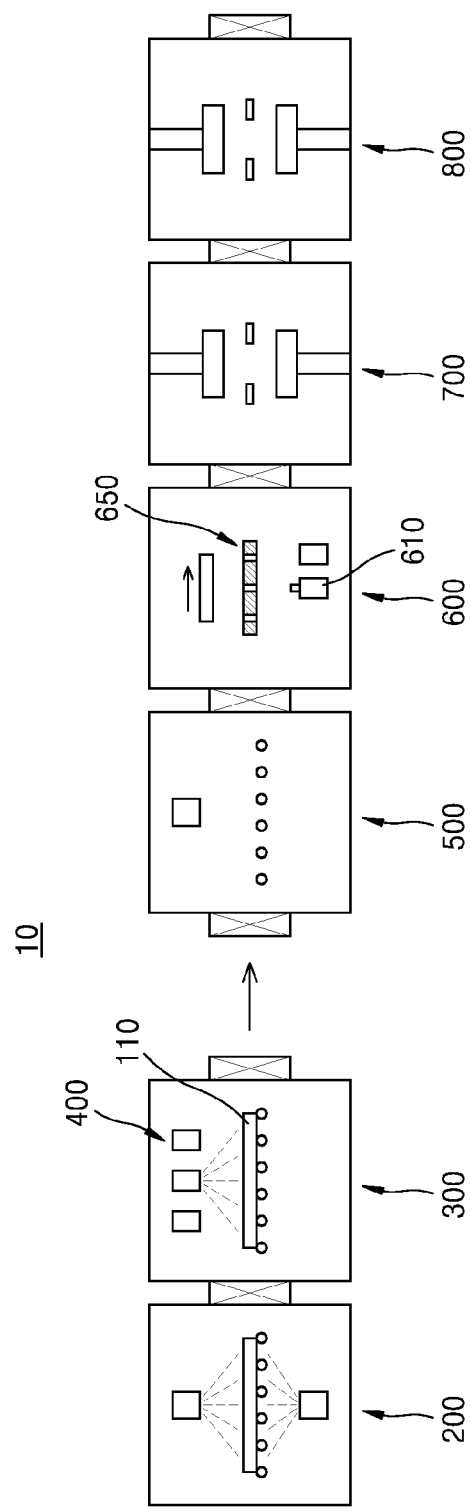
FIG. 4 is a conceptual view of an apparatus for manufacturing a display apparatus, according to an embodiment of the present invention.
Figure 5:
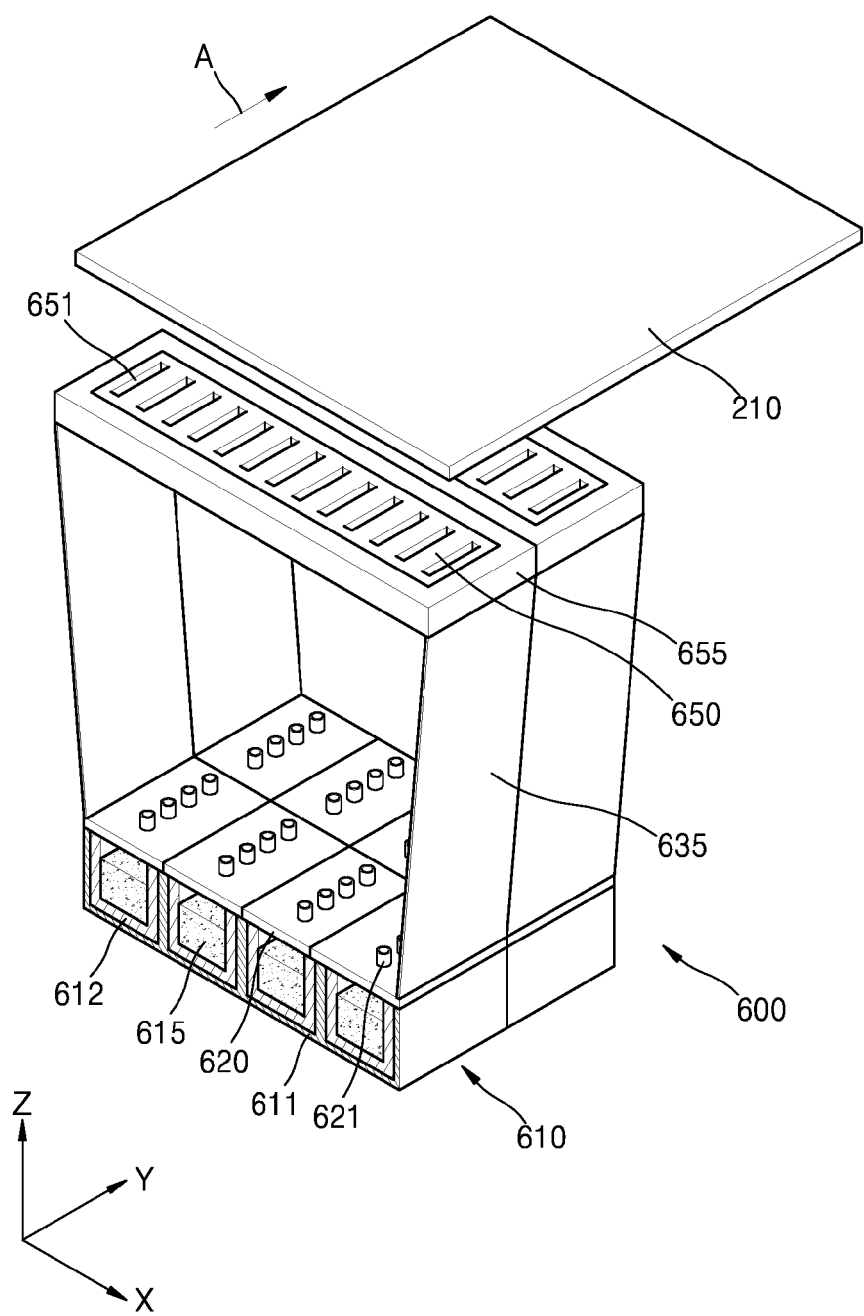
FIG. 5 is a perspective view of a deposition unit included in the apparatus illustrated in FIG. 4.

FIG. 4 is a conceptual view of an apparatus 10 for manufacturing a display apparatus, according to an embodiment of the present invention. FIG. 5 is a perspective view of a deposition unit 600 illustrated in FIG. 4.

Referring to FIGS. 4 and 5, the apparatus 10 for manufacturing a display apparatus may include a cleaning unit 200, a drying unit 300, a reflectivity measuring unit 400, a plasma processing unit 500, the deposition unit 600, an opposite electrode forming unit 700, and a plasma etching unit 800.

The apparatus 10 for manufacturing a display apparatus may be an in-line type. In this case, units may be connected to one another in an in-line manner or a cluster manner. According to another embodiment, each unit may be connected to each chamber. However, for convenience of description, a case where the apparatus 10 for manufacturing a display apparatus is formed in an in-line shape will now be described in detail.

The cleaning unit 200 sprays a cleaning solution to the first substrate 110 to remove a foreign matter from upper surfaces of the first substrate 110, the pixel electrode 181, and the pixel definition layer 190. The drying unit 300 may dry the first substrate 110 received from the cleaning unit 200. The drying unit 300 may dry the cleaning solution by supplying heated air or light.

The plasma processing unit 500 may perform plasma processing on the first substrate 110 received from the drying unit 300. At this time, the plasma processing unit 500 may remove a foreign material from the upper surface of the first substrate 110 via plasma.

The reflectivity measuring unit 400 may measure the reflectivity of the base in which the pixel electrode 181 and the pixel definition layer 190 have been formed on the first substrate 110. At this time, the reflectivity measuring unit 400 may partition the first substrate 110 into a plurality of areas and measure reflectivity of each of the areas.

The reflectivity measuring unit 400 may be mounted in any of various locations. For example, the reflectivity measuring unit 400 may be provided between the drying unit 300 and the plasma processing unit 500 or on at least one selected from the drying unit 300 and the plasma processing unit 500. In detail, when the reflectivity measuring unit 400 is provided between the drying unit 300 and the plasma processing unit 500, the reflectivity measuring unit 400 may include, for example, a chamber, a reflectivity measurer disposed within the chamber, and a conveyor which conveys the first substrate 110. According to another embodiment, when the reflectivity measuring unit 400 is provided on at least one selected from the drying unit 300 and the plasma processing unit 500, the reflectivity measuring unit 400 may be provided within at least one selected from the drying unit 300 and the plasma processing unit 500. For convenience of description, a case where the reflectivity measuring unit 400 is disposed within the drying unit 300 will now be described in detail.

The deposition unit 600 includes a deposition source 610, a deposition source nozzle unit 620, a patterning slit sheet 650, and a connection member 635.

Although a chamber is not illustrated in FIG. 5 for convenience of explanation, all the components of FIG. 5 may be respectively disposed within chambers that are maintained at an appropriate degree of vacuum, as illustrated in FIG. 4. The chambers are maintained at an appropriate vacuum in order to allow a deposition material to move in a substantially straight line through the deposition unit 600.

In detail, in order to deposit a deposition material 615 that is emitted from the deposition source 610 and is discharged through the deposition source nozzle unit 620 and the patterning slit sheet 650, onto the first substrate 110 in a desired pattern, it is required to maintain a chamber in a high-vacuum state as in a deposition method using a fine metal mask (FMM). In addition, the temperatures of the patterning slit sheet 650 and the connection member 635 should be sufficiently lower than the temperature of the deposition source 610 to maintain a space between the deposition source nozzle unit 620 and the patterning slit sheet 650 in a high-vacuum state. In this regard, the temperatures of the patterning slit sheet 650 and the connection member 635 may be about 100° C. or less. This is because the deposition material 615 that has collided the connection member 635 may not be vaporized again when the temperature of the patterning slit sheet 650 is sufficiently low. In addition, thermal expansion of the patterning slit sheet 650 may be minimized when the temperature of the patterning slit sheet 650 is sufficiently low.

The first substrate 110, which constitutes a deposition target on which the deposition material 615 is to be deposited, is disposed in the chamber. The first substrate 110 may be a substrate for flat panel displays. A large substrate for manufacturing a plurality of flat panel displays, may be used as the first substrate 110. Other substrates may also be employed.

While the first substrate 110 is moving relative to the deposition unit 600, deposition may be performed.

In particular, in a typical FMM deposition method, the size of the FMM has to be equal to the size of a substrate. Thus, the size of the FMM has to be increased as the substrate becomes larger. However, it is neither straightforward to manufacture a large FMM nor to extend an FMM to be accurately aligned with a pattern.

In the deposition unit 600, deposition may be performed while the deposition source 610 or the first substrate 110 is moved relative to each other. In embodiments, deposition may be continuously performed while the first substrate 110, which is disposed such as to face the deposition source 610, is moved in a Y-axis direction. In other words, deposition is performed in a scanning manner. Although the first substrate 110 is illustrated as being moved in the Y-axis direction of FIG. 5 when deposition is performed, embodiments of the present invention are not limited thereto. Deposition may be performed while the deposition unit 600 is moved in the Y-axis direction, whereas the first substrate 110 is fixed.

In the deposition unit 600, the patterning slit sheet 650 may be significantly smaller than a FMM used in a typical deposition method. In other words, in the deposition unit 600, deposition is continuously performed, i.e., in a scanning manner, while the first substrate 110 is moved in the Y-axis direction. Thus, a length of the patterning slit sheet 150 in the Y-axis direction may be significantly less than a length of the first substrate 110 provided a width of the patterning slit sheet 650 in the X-axis direction and a width of the first substrate 110 in the X-axis direction are substantially equal to each other. As described above, since the patterning slit sheet 650 may be formed to be significantly smaller than a FMM used in a typical deposition method, it is relatively easy to manufacture the patterning slit sheet 650 used in the present invention. In other words, using the patterning slit sheet 650, which is smaller than a FMM used in a typical deposition method, is more convenient in all processes, including etching and other subsequent processes, such as precise extension, welding, moving, and cleaning processes, compared to the typical deposition method using the larger FMM. This is more advantageous for a relatively large display apparatus.

In order to perform deposition while the deposition unit 600 or the first substrate 110 is moved relative to the other as described above, the deposition unit 600 and the first substrate 110 may be separated from each other by a predetermined distance.

The deposition source 610 that contains and heats the deposition material 615 is disposed in an opposite side of the chamber to a side in which the first substrate 110 is disposed. While the deposition material 615 contained in the deposition source 610 is vaporized, the deposition material 615 is deposited on the first substrate 110.

In detail, the deposition source 610 may include a crucible 611 that is filled with the deposition material 615, and a heater 612 that heats the crucible 611 to vaporize the deposition material 615, which is contained in the crucible 611, towards a side of the crucible 611, and in particular, towards the deposition source nozzle unit 620.

The deposition source nozzle unit 620 may be disposed at a side of the deposition source 610, and in particular, at the side of the deposition source 610 facing the first substrate 110. The deposition source nozzle unit 620 may include a plurality of deposition source nozzles 621 arranged at equal intervals in the X-axis direction. The deposition material 615 that is vaporized in the deposition source 610, passes through the deposition source nozzle unit 620 towards the first substrate 110 on which the deposition material 615 is to be deposited.

The deposition source 610 may form different temperatures according to the measured reflectivities and deposit the deposition material 615 on the first substrate 110 to form the intermediate layer 182 to have different thicknesses. In this case, a plurality of the deposition sources 610 may be included, or the single deposition source 610 may include a plurality of crucibles 611 and a plurality of heaters 612 respectively provided in the crucibles 611. However, for convenience of description, a case where the single deposition source 610 includes a plurality of crucibles 611 and a plurality of heaters 612 will now be described in detail.

Such a relationship between reflectivity and a temperature and a relationship between the reflectivity and the intermediate layer 182 may be obtained via an experiment or the like and stored in the form of a table or program.

The deposition source 610 may control an amount of the deposition material 615 that evaporates, by maintaining different temperatures according to reflectivitives. At this time, the deposition source 610 may maintain a second temperature that is higher than a first temperature used to deposit the deposition material 615 in the area A, in order to more evaporate the deposition material 615 in the area B than in the area A. On the other hand, the deposition source 610 may maintain a third temperature that is lower than the first temperature, in order to less evaporate the deposition material 615 in the area C than in the area A.

The deposition source 610 may control the amount of the deposition material 615 that evaporates, by controlling the temperature as described above. Accordingly, the deposition source 610 is able to adjust the thickness of the intermediate layer 182 such that the intermediate layer 182 has different thicknesses according to areas.

The patterning slit sheet 650 and a patterning slit sheet frame 655 in which the patterning slit sheet 650 is bound may be disposed between the deposition source 610 and the first substrate 110. The patterning slit sheet frame 655 may be formed in a lattice shape, similar to a window frame. The patterning slit sheet 650 is bound inside the patterning slit sheet frame 655. The patterning slit sheet 650 may include a plurality of patterning slits 651 arranged in the X-axis direction.

The deposition material 615 that is vaporized in the deposition source 610, passes through the deposition source nozzle unit 620 and the patterning slit sheet 650 towards the first substrate 110 on which the deposition material 615 is to be deposited. The patterning slit sheet 650 may be manufactured by etching, which is the same method as used in a typical method of manufacturing an FMM, and in particular, a striped FMM.

In this regard, in the deposition unit 600, the total number of patterning slits 651 may be greater than the total number of deposition source nozzles 621.

In addition, the deposition source 610 and the deposition source nozzle unit 620 coupled to the deposition source 610 may be disposed to be separated from the patterning slit sheet 650 by a predetermined distance. Alternatively, the deposition source 610 and the deposition source nozzle unit 620 coupled to the deposition source 610 may be connected to the patterning slit sheet 650 by the connection member 635. That is, the deposition source 610, the deposition source nozzle unit 620, and the patterning slit sheet 650 may be integrally formed as one body by being connected to each other via the connection member 635. The connection member 635 guides the deposition material 615, which is discharged through the deposition source nozzles 621, to move straight, not to flow in the X-axis or Y-axis direction. In FIG. 5, the connection members 635 are formed on left and right sides of the deposition source 610, the deposition source nozzle unit 620, and the patterning slit sheet 650 to guide the deposition material 615 not to flow in the X-axis direction; however, aspects of the present invention are not limited thereto. That is, the connection member 635 may be formed as a sealed box to guide flow of the deposition material 615 both in the X-axis and Y-axis directions.

As described above, the deposition unit 600 performs deposition while being moved relative to the first substrate 110. In order to move the deposition unit 600 relative to the first substrate 110, the patterning slit sheet 650 is separated from the first substrate 110 by a predetermined distance.

In particular, in a typical deposition method using a FMM, deposition is performed with the FMM in close contact with a substrate in order to prevent formation of a shadow zone on the substrate. However, when the FMM is used in close contact with the substrate, the contact may cause defects. In addition, in the typical deposition method, the size of the mask has to be the same as the size of the substrate since the mask cannot be moved relative to the substrate. Thus, the size of the mask has to be increased as display apparatuses become larger. However, it is not easy to manufacture such a large mask.

In the deposition source 600 according to the current embodiment, the patterning slit sheet 650 is disposed to be separated from the first substrate 110 by a predetermined distance.

As described above, according to embodiments of the present invention, a mask is formed to be smaller than a substrate, and deposition is performed while the mask is moved relative to the base. Thus, the mask can be easily manufactured. In addition, defects caused due to the contact between a substrate and a FMM, which occur in the typical deposition method, may be prevented. Furthermore, since it is unnecessary to dispose the FMM in close contact with the substrate during a deposition process, the manufacturing time may be reduced.

The deposition material 615 may be any of the various materials. For example, the deposition material may be a material used to form the organic emission layer 182d. The deposition material may be a material used to form the functional layer 182c. Besides, the deposition material may include any of materials that may be deposited via the deposition unit 600 from among the materials used to form layers that constitute the intermediate layer 182.

The opposite electrode forming unit 700 may form an opposite electrode on the intermediate layer 182. The plasma etching unit 800 may remove an organic material from an edge of the first substrate 110.

Referring to a method of operating the apparatus 10 for manufacturing a display apparatus, the first substrate 110 on which a plurality of pixel electrodes 181 and the pixel definition layer 190 have been formed may be provided to the cleaning unit 200. The cleaning unit 200 may clean the first substrate 110 by spraying a cleaning solution.

The cleaned first substrate 110 may be transferred to the drying unit 300, and thus the cleaning solution remaining on the cleaned first substrate 110 may be dried. In the drying unit 300, the reflectivity measuring unit 400 may measure the reflectivity of the first substrate 110. The reflectivity of the first substrate 110 may differ in each area according to unevenness of the pixel electrodes 181, the pixel definition layer 190, and the like and thicknesses or the like of other layers or films. In this case, as described above, color saturation non-uniformity maybe generated.

The deposition unit 600 may form the intermediate layer 182 to have different thicknesses, based on the measured reflectivity of the first substrate 110. In this case, the deposition unit 600 may form the intermediate layer 182 to have different thicknesses, by adjusting the thickness of at least one selected from the common layers and the functional layer 182c.

In detail, the deposition unit 600 may form the thickness of a center portion (area A) of the first substrate 110 to be different from that of another portion (area B or area C) of the first substrate 110, by comparing the reflectivity of the other portion (area B or area C) of the first substrate 110 with that of the center portion (area A) of the first substrate 110.

For example, when the reflectivity of the center portion (area A) of the first substrate 110 is smaller than that of the other portion (area B or area C) of the first substrate 110, the deposition unit 600 may form the intermediate layer 182 on the center portion (area A) of the first substrate 110 to have a thickness that is smaller than that of the intermediate layer 182 on the other portion (area B or area C) of the first substrate 110. On the other hand, when the reflectivity of the center portion (area A) of the first substrate 110 is greater than that of the other portion (area B or area C) of the first substrate 110, the deposition unit 600 may form the intermediate layer 182 on the center portion (area A) of the first substrate 110 to have a thickness that is greater than that of the intermediate layer 182 on the other portion (area B or area C) of the first substrate 110. In this case, the deposition unit 600 may form the intermediate layer 182 to have different thicknesses in different areas, by controlling an operation of the heater 612 within the deposition source 610. In other words, as described above, the deposition source 610 may control the degree of evaporation of the deposition material 615 by controlling the temperature based on the reflectivity of each area.

After the intermediate layer 182 is formed as described above, the opposite electrode 183 may be formed on the intermediate layer 182. An organic material may be removed from the edge of the first substrate 110 via plasma.

Thus, in the apparatus 10 for and a method of manufacturing a display apparatus, the thickness of the intermediate layer 182 is synchronized with the reflectivity of the first substrate 110, and thus color saturation uniformity of the first substrate 110 due to a difference between reflectivities of some portions of the first substrate 110 may be minimized.

In the apparatus 10 for and the method of manufacturing a display apparatus, the reflectivity of the first substrate 110 is measured during the manufacture of the display apparatus and is applied to the deposition unit 600, thereby reducing the manufacturing time and the manufacturing costs.

In the apparatus 10 for and the method of manufacturing a display apparatus, the display apparatus 100 having color uniformity is manufactured, thereby improving a manufacture yield of the display apparatus 100.

Display apparatuses according to embodiments of the present invention have improved color saturation.

It should be understood that the embodiments described herein should be considered in a descriptive sense only and not for purposes of limitation. Descriptions of features or aspects within each embodiment should typically be considered as available for other similar features or aspects in other embodiments.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A method of manufacturing a display apparatus, the method comprising:
    providing a base comprising:
        a substrate,
        a plurality of pixel electrodes formed over the substrate, and
        a pixel definition layer formed over the substrate and the plurality of pixel electrodes,
        wherein the base is divided into a plurality of areas comprising a first area and a second area;
    measuring reflectivities of the first and second areas wherein a measured reflectivity of the first area is different from that of the second area;
    placing the base in a deposition chamber to be spaced from a deposition unit provided in the deposition chamber; and
    forming a first intermediate layer over a first one of the pixel electrodes in the first area;
    moving the base relative to the deposition unit;
    forming a second intermediate layer over a second one of the pixel electrodes in the second area, wherein the first intermediate layer has a first thickness and the second intermediate layer has a second thickness different from the first thickness.

2. The method of claim 1, further comprising:
    cleaning the base; and
    drying the cleaned base.

3. The method of claim 1, further comprising performing plasma processing on the base.

4. The method of claim 1, wherein the deposition unit comprises a plurality of deposition sources configured to emit the deposition material, and wherein a temperature of each of the plurality of deposition sources is controlled based on the reflectivity of each of the plurality of areas.

5. The method of claim 1, further comprising adjusting a temperature of deposition sources such that the temperature of the deposition sources for forming the first intermediate layer is different from that of the deposition sources for forming the second intermediate layer,
    wherein the first area is a center portion of the base and the second area is another portion of the first base.

6. The method of claim 1, wherein the first area is a center portion of the base and the second area is another portion of the first base.

7. The method of claim 1, wherein the reflectivity of the first area is greater than that of the second area, wherein the thickness of the first intermediate layer is smaller than that of the second intermediate layer.

8. The method of claim 1, wherein the intermediate layers formed over the first area have substantially the same thickness.

9. The method of claim 1, wherein the intermediate layer comprises a common layer and a functional layer, and at least one selected from a thickness of the common layer and a thickness of the functional layer varies according to the plurality of areas of the base.

* * * * *